United States Patent
Fu

(10) Patent No.: US 6,174,171 B1
(45) Date of Patent: Jan. 16, 2001

(54) ELECTRICAL CONNECTOR WITH PICK-AND-PLACE MEMBER

(75) Inventor: Samuel Fu, Pen-Chiao (TW)

(73) Assignee: Hon Hai Precision Ind. Co., Ltd., Taipei Hsien (TW)

( * ) Notice: Under 35 U.S.C. 154(b), the term of this patent shall be extended for 0 days.

(21) Appl. No.: 09/273,930

(22) Filed: Mar. 22, 1999

(30) Foreign Application Priority Data

Mar. 20, 1998 (TW) .................................................. 87204166

(51) Int. Cl.[7] .............................. H01R 29/00; H01R 13/44
(52) U.S. Cl. ............................................. 439/41; 439/135
(58) Field of Search ............................ 439/41, 135, 148, 439/149, 150, 892

(56) References Cited

U.S. PATENT DOCUMENTS

| | | | |
|---|---|---|---|
| 3,187,227 | * 6/1965 | Chu et al. ............................ | 361/772 |
| 5,796,073 | * 8/1998 | Mattis et al. ........................ | 219/265 |
| 6,019,617 | * 2/2000 | Liu et al. ............................. | 439/135 |

* cited by examiner

Primary Examiner—Brian Sircus
Assistant Examiner—Chandrika Prasad
(74) Attorney, Agent, or Firm—Wei Te Chung

(57) ABSTRACT

An electrical connector includes an insulative connector body having a bottom face adapted to be mounted to a circuit board and an opposite top face on which a pick-and-place plate is releasably attached. The top face of the connector defines at least one recess. The pick-and-place plate has a flat first surface adapted to be engaged by a vacuum suction device and an opposite second surface forming a projection corresponding to each recess of the insulative body. The projection and the recess are dimensioned to have a force fitting engagement therebetween to releasably attach the pick-and-place plate to the top face of the insulative body.

6 Claims, 3 Drawing Sheets

ELECTRICAL CONNECTOR WITH PICK-AND-PLACE MEMBER

BACKGROUND OF THE INVENTION

1. Field of the Invention

The present invention generally relates to an electrical connector, and in particular to an electrical connector on which a pick-and-place plate is releasably attached by means of force-fitting.

2. The Prior Art

As the trend of the computer industry continues toward miniaturization, more parts are arranged in a smaller space inside the computer. This is particularly true for notebook computers. To meet such a requirement, a number of circuit boards are stacked on top of each other inside the computer and each circuit board has as many electronic elements and/or device mounted thereon as possible. To arrange as many electronic elements/devices as possible on a particular circuit board and to accommodate as many circuit boards as possible inside the computer, the electronic elements/devices must be as space efficient as possible. Among the electronic elements/devices mounted on the computer circuit boards, electrical connectors occupy a significant amount of space and miniaturization of the electrical connector is effective in more fully exploiting the space inside the computer.

A size-reduced or minimized connector requires a corresponding reduction in size of the conductive traces on the circuit board. This makes it more difficult to properly retain the connector at its correct position on the circuit board in order to proceed with a soldering process which permanently fixes the connector to the circuit board.

Conventionally, the connector is temporarily retained on the circuit board is by means of a suction force from a vacuum until the soldering process is complete. To use the vacuum to retain the connector, the connector must have a flat surface with which a suction cup may be engageable. Traditionally, the flat surface is provided by a plate-like member, commonly referred to as pick-and-place plate, releasably fixed to the connector by means of adhesive film or tape or by using resilient clips which engage with side walls of the connector. Examples are shown in U.S. Pat. Nos. 4,396,245, 4,645,278, 5,026,295 and 5,383,797.

However, both methods have disadvantages. For the adhesive film method, adhesive material may be left on the connector after the film is removed and dust and other foreign particles may become attached thereto thereby resulting in contamination. In addition, the adhesive film must be purchased separately thereby increasing costs.

When using a resilient clip to secure the pick-and-place plate to the connector, the clip may damage the connector. Furthermore, the clip must be in perfect alignment with the connector in order to be properly mounted thereto. In addition, incorrectly fitting the clip onto the connector may complicate removal of the pick-and-place plate and the clip from the connector. Moreover, the pick-and-place plate which utilizes the resilient clip has a complicated configuration thereby complicating manufacture and increasing costs.

It is thus desirable to have an improved connector with a pick-and-place plate to overcome the problems of the prior art.

SUMMARY OF THE INVENTION

Accordingly, an object of the present invention is to provide a connector comprising a pick-and-place plate easily and releasably mounted thereon.

Another object of the present invention is to provide a connector comprising a pick-and-place plate which does not cause damage or contamination to the connector during removal from the connector.

A further object of the present invention is to provide a connector comprising a pick-and-place plate having a simple configuration thereby facilitating manufacture and reducing costs.

To achieve the above objects, an electrical connector in accordance with the present invention comprises an insulative body having a bottom face adapted to be mounted to a circuit board and an opposite top face on which a pick-and-place plate is releasably attached. The top face of the connector defines at least one recess. The pick-and-place plate has a flat first surface adapted to be engaged by a vacuum suction device and an opposite second surface forming thereon a projection corresponding to each recess of the insulative body. The projection and the recess are dimensioned to have a force fitting engagement therebetween to releasably attach the pick-and-place plate to the top face of the insulative body.

BRIEF DESCRIPTION OF THE DRAWINGS

The present invention will be apparent to those skilled in the art by reading the following description of preferred embodiments thereof, with reference to the accompanying drawings, in which.

DETAILED DESCRIPTION OF THE PREFERRED EMBODIMENTS

Figure 1:
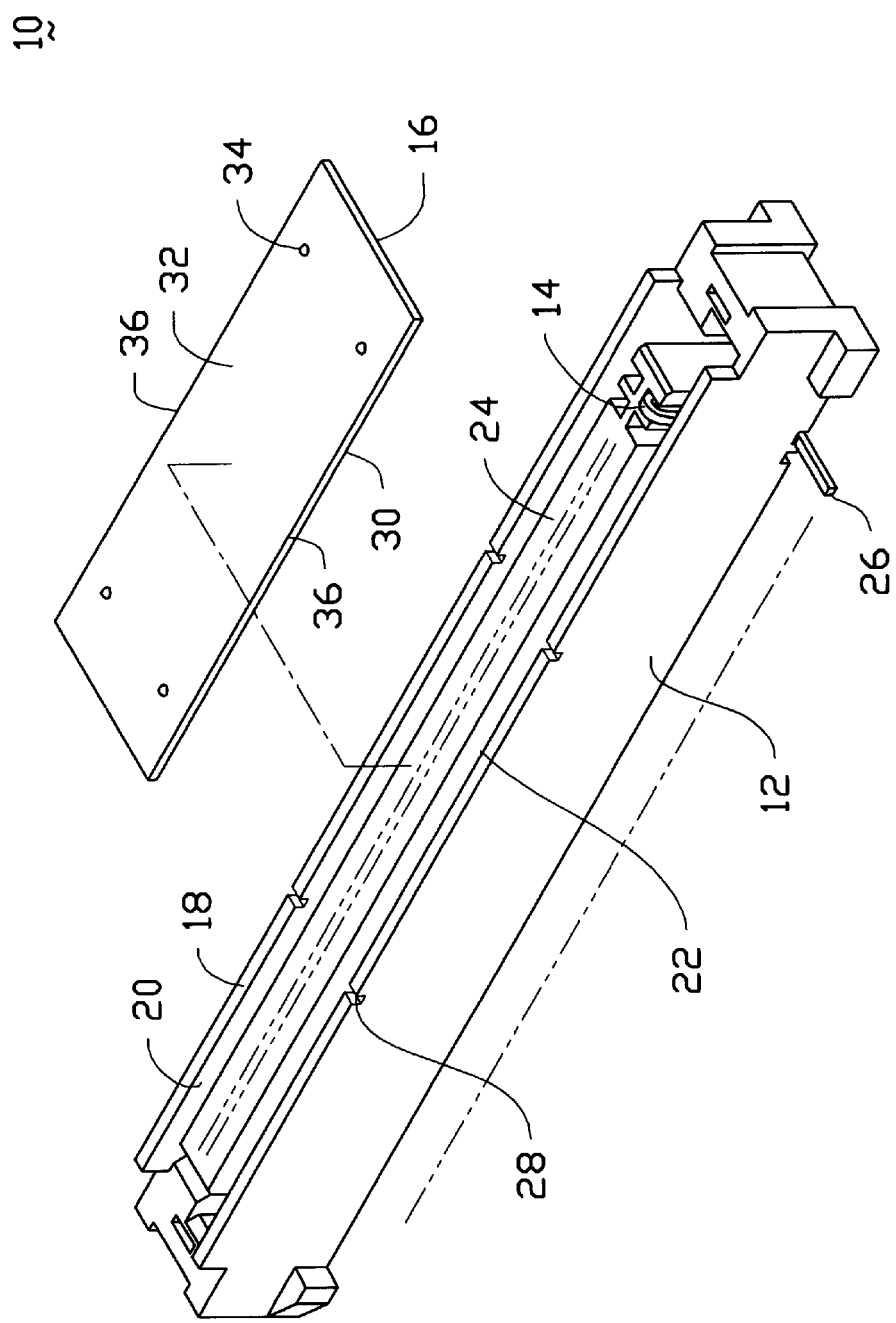
FIG. 1 is an exploded view of an electrical connector constructed in accordance with a first embodiment of the present invention.
Figure 2:
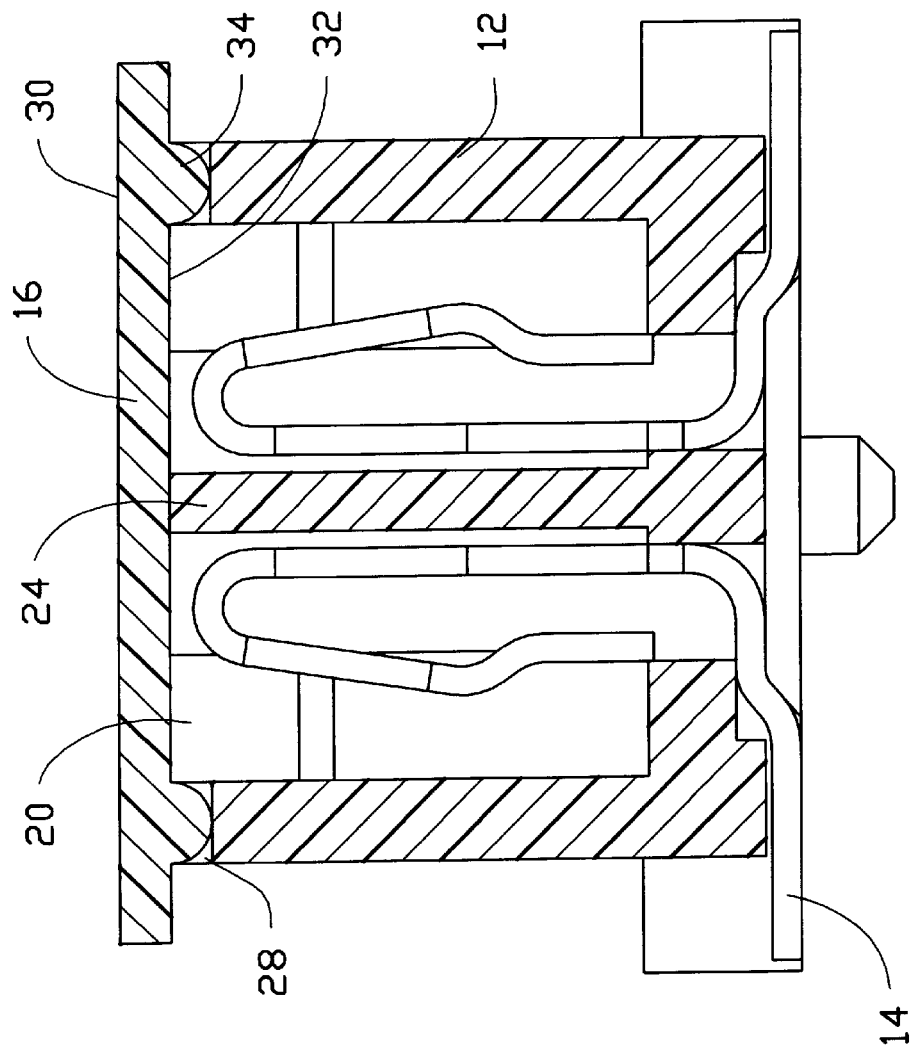
FIG. 2 is a cross-sectional view of the electrical connector of FIG. 1.

With reference to the drawings and in particular to FIGS. 1 and 2, an electrical connector 10 constructed in accordance with a first embodiment of the present invention comprises an insulative body 12 having opposite side walls 22 and a connection surface 18 formed along a top portion of the side walls 22 and defining a slot 20 between the side walls 22. An internal wall member 24 is fixed inside the slot 20 and a plurality of terminal pins 14 are assembled therein for electrically engaging with a mating connector. The terminal pins 14 each have an extension 26 to connect to a circuit board on which the connector 10 is to be mounted.

A pick-and-place plate 16 is provided to releasably attach to the connection surface 18 of the insulative body 12. The pick-and-place plate 16 has a first surface 30 which is substantially flat and thus engageable by a vacuum suction device (not shown) and an opposite second surface 32 to be positioned on the connection surface 18 of the insulative body 12.

A force-fitting engagement is formed between the pick-and-place plate 16 and the connection surface 18 of the insulative body 12. This is done by defining at least one recess 28 in the connection surface 18 of the insulative body 12. The pick-and-place plate 16 forms a projection 34 on the second surface 32 thereof, which may be in the form of a circular dimple, corresponding to each recess 28 of the connection surface 18 of the insulative body 12. The projection 34 is dimensioned to be force-fit into the recess 18 thereby attaching the pick-and-place plate 30 to the connection surface 18 of the insulative body 12.

In the embodiment illustrated, the pick-and-place plate 30 forms four such projections 34 on the second surface 32 thereof. The insulative body 12 defines a pair of such recesses 28 in each side wall 22. Preferably, the recesses 28 extend completely through the side walls 22. Furthermore, the recesses 28 on opposite side walls 22 may be aligned with each other so that each pair of aligned recesses 28 defines a common groove through the connection surface 18. In this respect, the projections 34 may be replaced by two elongate rib sections for being received in a force-fitting manner into the corresponding grooves of the connection surface 18 of the insulative body 12.

Preferably, the pick-and-place plate 16 is sized to have two opposite lateral edges 36 thereof projecting beyond the side walls of the insulative body 12 whereby the pick-and-place plate 16 may be easily removed by applying a force on the edges 36 or by simply grasping the edges 36 and moving the pick-and-place plate 16 upward.

Figure 3:
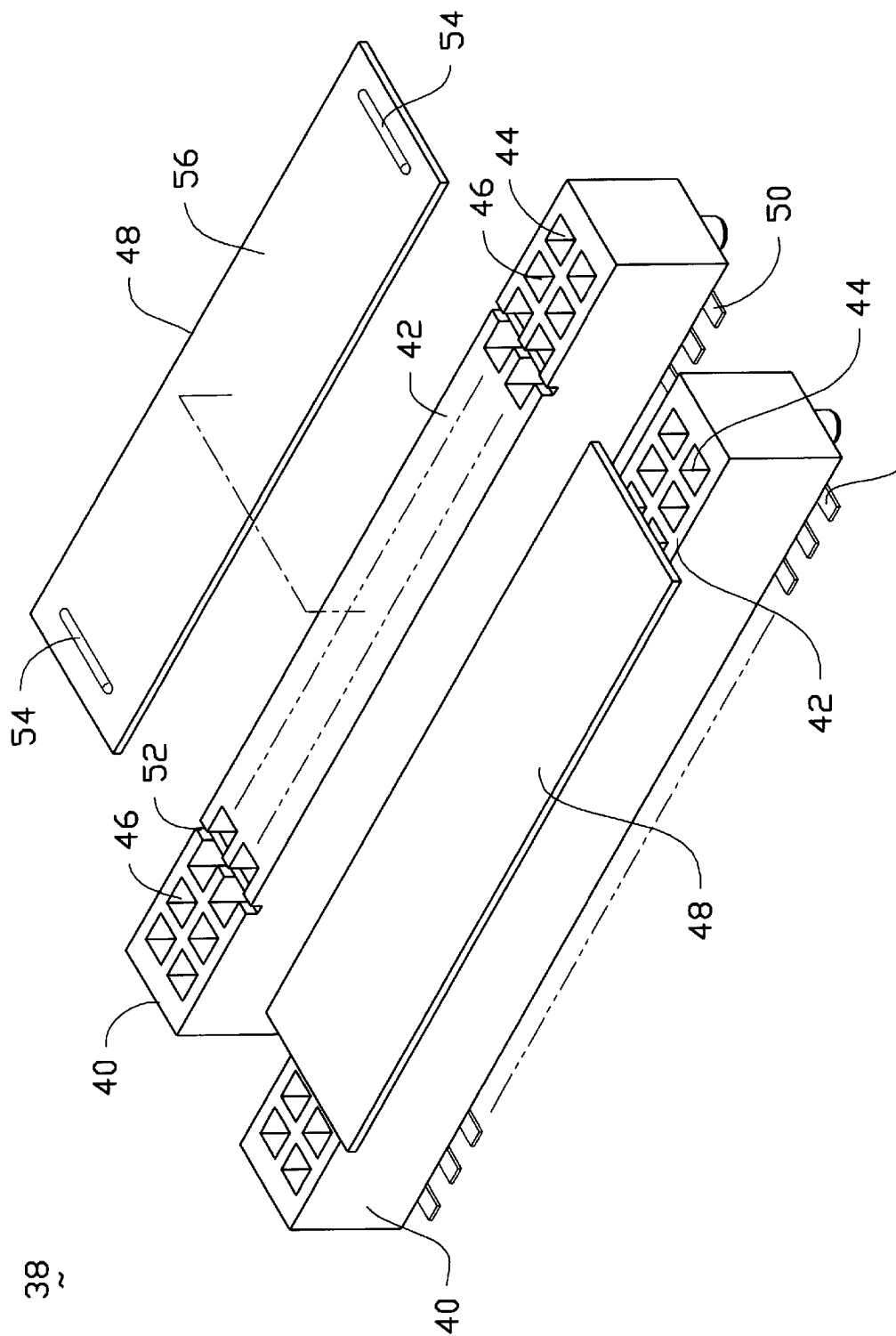
FIG. 3 is an exploded view of an electrical connector constructed in accordance with a second embodiment of the present invention.

Although the present invention has been shown and explained with reference to a particular configuration of the connector 10, it is apparent to those skilled in the art to embody the present invention in connectors having configurations different from that shown in FIGS. 1 and 2. This is demonstrated in FIG. 3 which shows a second embodiment of the present invention. A connector 38 comprises an insulative body 40 having a connection surface 42 and defining a plurality of channels 44 substantially normal to the connection surface 42 for receiving terminal pins 50 therein each having an end projecting beyond the insulative body 40. Each channel 44 has an opening 46 exposed to the connection surface 42.

A pick-and-place plate 48 is provided to be releasably attached to the connection surface 42 of the insulative body 40. The pick-and-place plate 48 has a flat first surface (not labeled) and an opposite second surface 56 to be positioned on the connection surface 42 of the insulative body 40.

At least one recess 52, which in the embodiment illustrated is shaped like a groove, is defined in the connection surface 42, preferably across the connection surface 42. An elongate rib 54 is formed on the second surface 56 of the pick-and-place plate 48 corresponding to each of the recesses 52. The rib 54 is sized to be force-fit into the recess 52 of the insulative body 40 for releasably attaching the pick-and-place plate 48 to the connection surface 42 of the insulative body 40.

In the embodiment illustrated, two such recesses 52 are defined in the connection surface 42 of the insulative body 40 and, correspondingly, the pick-and-place plate 48 forms two ribs 54 on the second surface 56 thereof to be respectively force fit into the recesses 52.

The pick-and-place plate as shown and described above has a very simple configuration which may be formed from a metal plate by means of a simple stamping or pressing operation whereby the manufacturing cost of the pick-and-place plate is significantly reduced.

Although the present invention has been described with reference to preferred embodiments, it is apparent to those skilled in the art that there are a variety of modifications and changes that may be made without departing from the scope of the present invention which is intended to be defined by the appended claims.

What is claimed is:

1. An electrical connector comprising:

an insulative body having two opposite side walls defining an interior space therebetween for receiving terminal pins therein, a connection surface being formed along top portions of the side walls; and a pick-and-place plate having a flat first surface adapted to be engaged and held by an external holding device and an opposite second surface releasably attached to the connection surface of the insulative body; and the improvements comprising at least one recess defined in the connection surface of the insulative body and extending completely through the connection surface in a direction transversing a lengthwise direction of the side walls, the pick-and-place plate forming a projection on the second surface thereof corresponding to the recess of the insulative body, each projection being dimensioned to be force fitted in the corresponding recess the pick-and-place plate being attached to the insulative body essentially by a fitting force between the projection and the body.

2. The electrical connector as claimed in claim 1, wherein the insulative body defines four recesses in the connection surface thereof and, correspondingly, the pick-and-place plate forms four projections for being received in the recesses in a force-fitting manner.

3. The electrical connector as claimed in claim 1, wherein the projection is a circular dimple.

4. The electrical connector as claimed in claim 1, wherein the recess is a groove and wherein the projection is a rib force-fittable into the groove.

5. The electrical connector as claimed in claim 4, wherein the insulative body defines two grooves in the connection surface thereof and, correspondingly, the pick-and-place plate forms two ribs receivable in the grooves in a force-fitting manner.

6. The electrical connector as claimed in claim 1, wherein the pick-and-place plate has two opposite edges projecting beyond the side walls of the insulative body.

* * * * *